(12) United States Patent
Yamada

(10) Patent No.: US 11,128,487 B2
(45) Date of Patent: Sep. 21, 2021

(54) CIRCUIT DEVICE, ELECTRONIC DEVICE, AND MOBILE BODY

(71) Applicant: SEIKO EPSON CORPORATION, Tokyo (JP)

(72) Inventor: Toshimichi Yamada, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 189 days.

(21) Appl. No.: 16/441,075

(22) Filed: Jun. 14, 2019

(65) Prior Publication Data

US 2019/0386846 A1    Dec. 19, 2019

(30) Foreign Application Priority Data

Jun. 15, 2018   (JP) .............................. JP2018-114404

(51) Int. Cl.
| | | |
|---|---|---|
| *H04L 12/40* | (2006.01) | |
| *H03K 19/0175* | (2006.01) | |
| *H04L 29/08* | (2006.01) | |
| *B60R 16/023* | (2006.01) | |
| *H04L 7/00* | (2006.01) | |
| *G06F 1/26* | (2006.01) | |

(Continued)

(52) U.S. Cl.
CPC ............ *H04L 12/40* (2013.01); *B60R 16/023* (2013.01); *H03K 19/017509* (2013.01); *H04L 69/323* (2013.01); *G01R 19/165* (2013.01); *G01R 27/08* (2013.01); *G06F 1/266* (2013.01); *G06F 13/4072* (2013.01); *H04L 7/0087* (2013.01); *H04L 2012/40273* (2013.01)

(58) Field of Classification Search
CPC .................. H04L 12/40; H04L 69/323; H04L 2012/40273; H04L 12/40013; H04L 7/0087; H03K 19/017509; B60R 16/023; G06F 1/266; G06F 13/4072
See application file for complete search history.

(56) References Cited

U.S. PATENT DOCUMENTS

| | | | |
|---|---|---|---|
| 6,405,330 B1 * | 6/2002 | Hanf .................. | G05B 19/0423 714/712 |
| 8,421,501 B1 * | 4/2013 | Rien .............. | H03K 19/018521 326/81 |

(Continued)

FOREIGN PATENT DOCUMENTS

JP        2014-117077 A      6/2014

OTHER PUBLICATIONS

Texas Instruments, "Voltage Level Translation Guide", 2011, Texas Instruments (Year: 2011).*

*Primary Examiner* — Paul H Masur
*Assistant Examiner* — Michael K Phillips
(74) *Attorney, Agent, or Firm* — Oliff PLC

(57) ABSTRACT

A circuit device includes a physical layer circuit coupled to a data bus, and a processing circuit that controls the physical layer circuit and performs communications processing through the data bus. The processing circuit operates with a voltage supplied from a ground line as a power supply voltage VSS on a low potential side, and the physical layer circuit operates based on a power supply voltage VSSA on the low potential side supplied from a power supply line not coupled to the ground line in the circuit device, and a power supply voltage HVDDA on a high potential side set with reference to the power supply voltage VSSA.

11 Claims, 13 Drawing Sheets

(51) Int. Cl.
   *G06F 13/40*      (2006.01)
   *G01R 27/08*      (2006.01)
   *G01R 19/165*     (2006.01)

(56) References Cited

U.S. PATENT DOCUMENTS

| | | | |
|---|---|---|---|
| 2010/0064148 A1* | 3/2010 | Ho | H02J 1/00 |
| | | | 713/300 |
| 2012/0044010 A1* | 2/2012 | Murakami | H03K 19/017509 |
| | | | 327/333 |
| 2012/0307931 A1* | 12/2012 | Johnson | H04L 25/026 |
| | | | 375/295 |
| 2013/0191566 A1* | 7/2013 | Kaestner | G06F 13/426 |
| | | | 710/104 |
| 2013/0285641 A1 | 10/2013 | Mkrtchyan et al. | |
| 2015/0362944 A1* | 12/2015 | Sporck | H02M 1/00 |
| | | | 323/303 |
| 2016/0173092 A1* | 6/2016 | Trivedi | H03K 19/017509 |
| | | | 327/333 |
| 2016/0378154 A1 | 12/2016 | Srivastava | |
| 2017/0025879 A1* | 1/2017 | Thompson | G06F 1/266 |
| 2017/0366333 A1* | 12/2017 | Chan | H04L 25/06 |

* cited by examiner

CIRCUIT DEVICE, ELECTRONIC DEVICE, AND MOBILE BODY

The present application is based on, and claims priority from JP Application Serial Number 2018-114404, filed Jun. 15, 2018, the disclosure of which is hereby incorporated by reference herein in its entirety.

BACKGROUND

1. Technical Field

The present disclosure relates to a circuit device, an electronic device, and a mobile body, for example.

2. Related Art

In a circuit device that communicates using a physical layer circuit, there is a problem of a voltage drop in a cable. For example, JP-A-2014-117077 discloses a voltage drop compensation circuit capable of flexibly performing appropriate voltage compensation control according to a change in the resistance value of a vehicle USB cable. In this voltage drop compensation circuit, when power is supplied from a host through the USB cable, a switch is switched to couple the USB cable to a resistor, and the resistance value of the USB cable is detected. After a predetermined period of time, the switch is switched to couple the USB cable to a portable device, and a voltage drop compensation operation is performed based on the detected resistance value.

SUMMARY

However, the voltage drop compensation circuit of JP-A-2014-117077 focuses only on the problem of a VBUS voltage drop, and does not address the occurrence of problems such as a voltage drop in a ground line or a communications error due to a voltage drop in the ground line.

One aspect of the disclosure relates to a circuit device that includes a physical layer circuit coupled to a data bus; and a processing circuit that controls the physical layer circuit and performs communications processing through the data bus. The processing circuit operates with a voltage of a ground line as a power supply voltage on a low potential side, and the physical layer circuit operates based on a first power supply voltage on the low potential side supplied from a first power supply line not coupled to the ground line in the circuit device, and a second power supply voltage on a high potential side set with reference to the first power supply voltage.

Also, in one aspect of the disclosure, the circuit device may include a level shifter that shifts the signal level of a signal from the processing circuit to the physical layer circuit and the signal level of a signal from the physical layer circuit to the processing circuit.

Also, in one aspect of the disclosure, the circuit device may include a measurement circuit that measures the voltage of the data bus, and a voltage generation circuit that generates the first power supply voltage based on a measurement result of the measurement circuit, and generates the second power supply voltage with reference to the generated first power supply voltage.

Also, in one aspect of the disclosure, a configuration may be adopted in which the physical layer circuit includes an HS driver serving as a USB HS mode transmission circuit, the data bus includes a DP signal line that transmits a USB signal DP and a DM signal line that transmits a USB signal DM, and the measurement circuit measures the voltage of at least one of the DP signal line and the DM signal line of the data bus coupled to the HS driver.

Also, in one aspect of the disclosure, the measurement circuit may measure the voltage of the DP signal line or the DM signal line in a period when a USB packet is not being communicated.

Also, in one aspect of the disclosure, a configuration may be adopted in which the circuit device includes a first terminal coupled to the ground line, and a second terminal coupled to the first power supply line that supplies the first power supply voltage, and the physical layer circuit operates based on the first power supply voltage supplied from outside of the circuit device to the second terminal through the first power supply line.

Also, in one aspect of the disclosure, the circuit device may include a voltage generation circuit that generates the second power supply voltage with reference to the first power supply voltage supplied to the second terminal.

Also, in one aspect of the disclosure, a configuration may be adopted in which the circuit device includes a third terminal coupled to a second power supply line that supplies the second power supply voltage, and the physical layer circuit operates based on the second power supply voltage supplied from outside of the circuit device to the third terminal through the second power supply line.

Also, another aspect of the disclosure relates to an electronic device including the above-described circuit device.

Also, another aspect of the disclosure relates to a mobile body including the above-described circuit device.

DESCRIPTION OF EXEMPLARY EMBODIMENTS

The following describes exemplary embodiments of the disclosure. Note that the embodiments described below do not unreasonably limit the scope of the disclosure described in the claims, and not all of the configurations described in these embodiments are necessary to solve problems addressed by the disclosure.

1. Circuit Device

Figure 1:
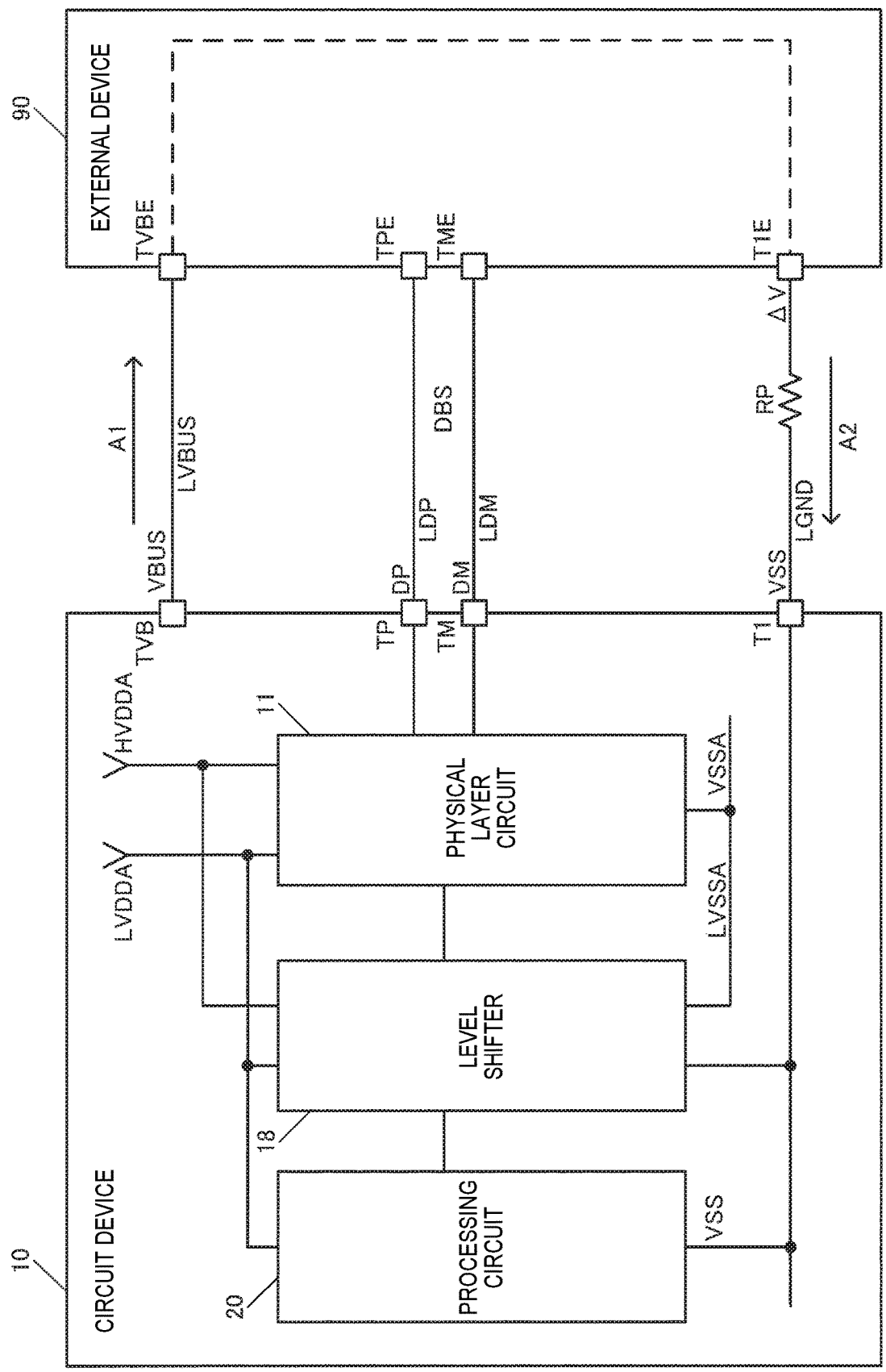
FIG. 1 shows a configuration example of a circuit device of the present embodiment.

FIG. 1 shows a configuration example of a circuit device 10 of the present embodiment. A circuit device 10 includes a physical layer circuit 11 and a processing circuit 20. The circuit device 10 can also include a level shifter 18. The physical layer circuit 11 is coupled to a data bus DBS. The data bus DBS includes a signal line LDP that is a signal line of a signal DP (DataPlus), and a signal line LDM that is a signal line of a signal DM (Data Minus). The signal line LDP is a DP signal line, and the signal line LDM is a DM signal line. The signals DP and DM are a first signal and a second signal constituting a differential signal. Terminals TP and TM of the circuit device 10 are coupled to terminals TPE and TME of an external device 90 through the signal lines LDP and LDM of the data bus DBS. Note that the coupling between circuits and the coupling between a bus or a signal line and a circuit in this embodiment are electrical couplings. An electrical coupling means coupling such that an electrical signal can be transmitted, and is a coupling that enables transmission of information by an electrical signal, and may be a coupling through a signal line or an active element or the like.

The physical layer circuit 11 is a circuit block configured with an analog circuit of a physical layer. The analog circuit of the physical layer is, for example, a transmission circuit that transmits data through the data bus DBS, a receiving circuit that receives data through the data bus DBS, or the like. Alternatively, the analog circuit of the physical layer may be various detection circuits, a pull up resistor circuit, a pull down resistor circuit, or the like.

The processing circuit 20 controls the physical layer circuit 11 to perform communications processing through the data bus DBS. For example, the processing circuit 20 outputs various control signals to the physical layer circuit 11, and performs packet transmission processing and packet receiving processing through the data bus DBS. Also, the processing circuit 20 can include a serial/parallel conversion circuit that converts serial data received through the data bus DBS into parallel data, a parallel/serial conversion circuit that converts parallel data into serial data, various link layer circuits, and the like. The processing circuit 20 can be realized by a logic circuit or the like employing automatic placement and routing, such as a gate array, for example. The processing circuit 20 may also be realized, for example, by a processor such as an MPU (Micro Processing Unit), a CPU (Central Processing Unit), or the like.

In the present embodiment, the processing circuit 20 operates with voltage supplied from a ground line LGND as a power supply voltage VSS on a low potential side. More specifically, the processing circuit 20 is operated by being supplied with the power supply voltage VSS on the low potential side and a power supply voltage LVDDA on a high potential side. The power supply voltage LVDDA is a voltage lower than a power supply voltage HVDDA, and for example, is a voltage for a logic circuit. The power supply voltage LVDDA may be supplied to the physical layer circuit 11. For example, a terminal T1 serving as a first terminal of the circuit device 10, and a terminal T1E of the external device 90, are coupled by the ground line LGND. The processing circuit 20 is operated by the power supply voltage VSS supplied from the ground line LGND.

On the other hand, the physical layer circuit 11 operates based on a power supply voltage VSSA on the low potential side supplied from a power supply line LVSSA not coupled to the ground line LGND in the circuit device 10. Also, the physical layer circuit 11 operates based on the power supply voltage HVDDA on the high potential side set with reference to the power supply voltage VSSA. The power supply line LVSSA is a first power supply line, the power supply voltage VSSA is a first power supply voltage, and the power supply voltage HVDDA is a second power supply voltage. For example, the power supply voltage HVDDA is generated with reference to the power supply voltage VSSA. That is, in the present embodiment, in the circuit device 10, the power supply line LVSSA, which is physically separated from the ground line LGND, is provided as an internal wire. For example, the ground line LGND and the power supply line LVSSA are not coupled by metal wiring within the circuit device 10, but are set to different potentials from each other. The processing circuit 20 is operated by the power supply voltage VSS from the ground line LGND, but the physical layer circuit 11 is operated not by the power supply voltage VSS, but by using the power supply voltage VSSA as the power supply voltage on the low potential side. The power supply voltage HVDDA set with reference to the power supply voltage VSSA is also used as the power supply voltage on the high potential side that operates the physical layer circuit 11. By adopting this sort of configuration, it is possible to properly operate the circuit device 10 even when a GND shift, described later with reference to FIGS. 3 to 6, occurs, and thus it is possible to prevent occurrence of a problem such as a communications error caused by the GND shift.

For example, in the present embodiment, the circuit device 10 on an upstream side supplies a voltage VBUS to the external device 90 on a downstream side. For example, a terminal TVB of the circuit device 10 and a terminal TVBE of the external device 90 are coupled by a power supply line LVBUS, and the voltage VBUS is supplied to the external device 90 through the power supply line LVBUS. Note that the voltage VBUS may be supplied by a charging circuit provided separately from the circuit device 10, instead of by the circuit device 10. As such a charging circuit, there is a circuit conforming to the specifications of USB BC 1.2 (Battery Charging Specification Rev 1.2), for example.

The external device 90 operates by being supplied with the voltage VBUS. For example, each circuit block of the external device 90 operates with a power supply voltage based on the voltage VBUS. For example, similarly to the circuit device 10, the external device 90 has a physical layer circuit and a processing circuit, and the physical layer circuit and the processing circuit operate with a power supply voltage based on the voltage VBUS. Alternatively, the external device 90 performs charging of a secondary battery or the like using the voltage VBUS. Therefore, much current flows to the power supply line LVBUS in a current path indicated by A1 in FIG. 1. Then, this current returns to the circuit device 10 side through the ground line LGND as indicated by A2. A parasitic resistance RP exists in the ground line LGND, so the current flows against the parasitic resistance RP as indicated by A2, and therefore the GND shift problem occurs. That is, the ground line LGND is grounded to nearly 0 V in the vicinity of the terminal T1 of the circuit device 10, but in the vicinity of the terminal T1E of the external device 90, the ground line LGND is shifted from 0 V, which is the GND potential, by ΔV due to the current flowing in the parasitic resistance RP. When this sort of GND shift occurs, as will be described in detail later with reference to FIGS. 3 to 6, problems occur such as a communications error in data communications through the data bus DBS, or exceeding a maximum rating of the external device 90.

In this regard, in the present embodiment, the physical layer circuit 11 operates based on the power supply voltage VSSA from the power supply line LVSSA that is not coupled to the ground line LGND in the circuit device 10. Also, the physical layer circuit 11 operates based on the power supply voltage HVDDA on the high potential side with reference to the power supply voltage VSSA. That is, as a power supply system of the physical layer circuit 11, the power supply system of the voltages VSSA to HVDDA is separately and independently provided. By operating the physical layer circuit 11 based on the power supply voltage VSSA from the power supply line LVSSA separated from the ground line LGND, it is possible to prevent the GND shift from influencing the physical layer circuit 11, and it is possible to prevent the occurrence of problems caused by the GND shift. Note that it is sufficient that the ground line LGND is not coupled to the power supply line LVSSA in the internal wiring within the circuit device 10, and these may be electrically coupled to each other in the external device 90, for example.

The circuit device 10 includes the level shifter 18 provided between the physical layer circuit 11 and the processing circuit 20. For example, the level shifter 18 is provided between the physical layer circuit 11 and the processing circuit 20 by electrical coupling. For example, the physical layer circuit 11 and the level shifter 18 are electrically coupled through a signal line, and the level shifter 18 and the processing circuit 20 are electrically coupled through a signal line. The level shifter 18 shifts the signal level of the signal from the processing circuit 20 to the physical layer circuit 11, and the signal level of the signal from the physical layer circuit 11 to the processing circuit 20. For example, the level shifter 18 is supplied with the power supply voltages HVDDA and LVDDA on the high potential side and the power supply voltages VSSA and VSS on the low potential side to perform level shifting of the signal level. For example, the level shifter 18 shifts the level of a signal in the voltage range from the voltage VSSA to the voltage HVDDA to a signal in the voltage range from the voltage VSS to the voltage LVDDA. Alternatively, the level shifter 18 shifts the level of a signal in the voltage range from the voltage VSS to the voltage LVDDA to a signal in the voltage range from the voltage VSSA to the voltage HVDDA. The signal to be level-shifted by the level shifter 18 is a data signal communicated through the data bus DBS, a control signal of the physical layer circuit 11, or the like. When such a level shifter 18 is provided, even when the physical layer circuit 11 is operated by the power supply voltages HVDDA and VSSA, a signal from the processing circuit 20 can be transmitted to the physical layer circuit 11 at an appropriate signal level, and a signal from the physical layer circuit 11 can be transmitted to the processing circuit 20 at an appropriate signal level. That is, it is possible to absorb a shift in ΔV due to the GND shift by the level shifter 18, and thus it is possible to provide stable communications.

Figure 2:
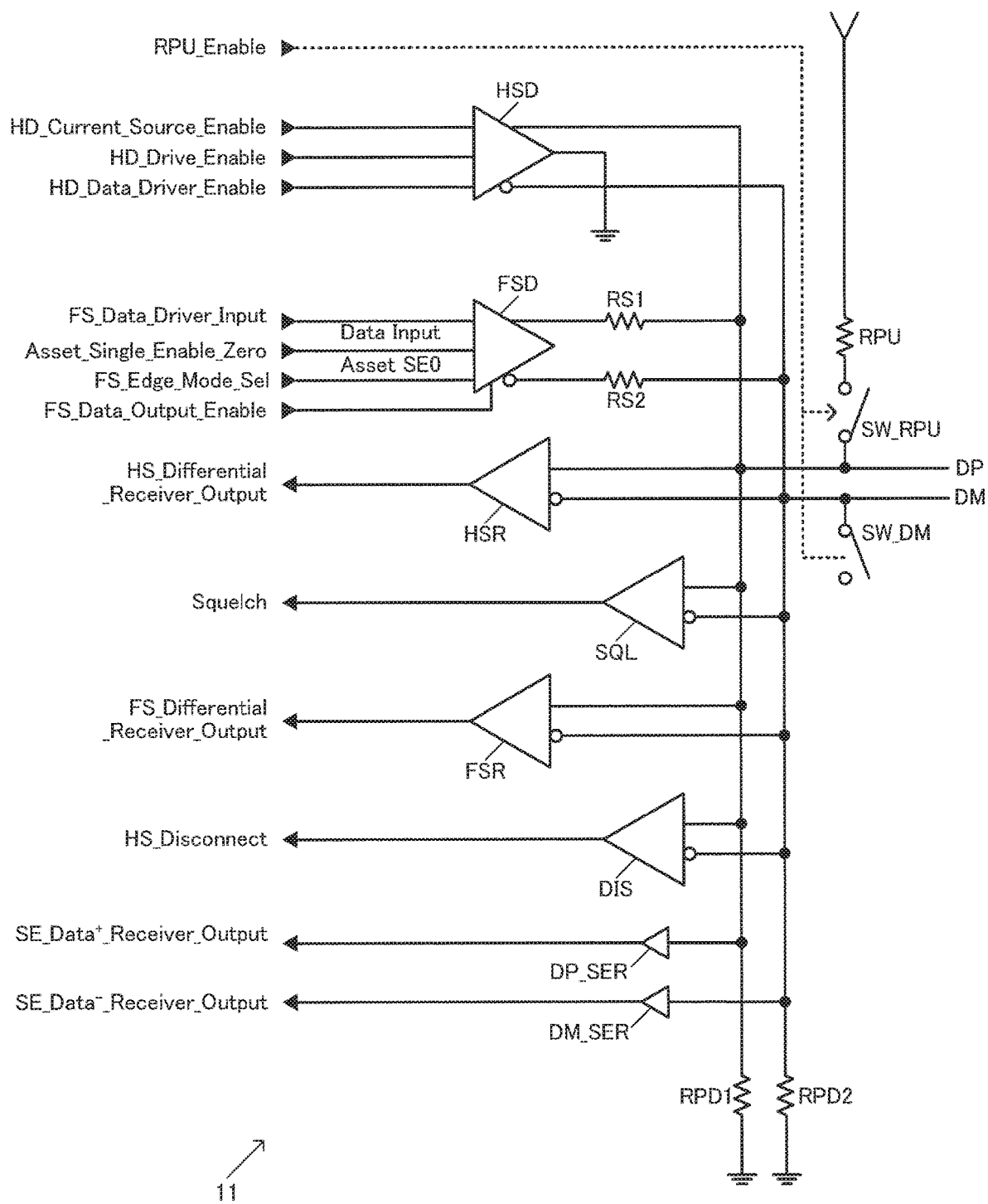
FIG. 2 shows a configuration example of a physical layer circuit.

FIG. 2 shows a configuration example of the physical layer circuit 11. Note that in the following description, mainly a case where the technique of the present embodiment is applied to USB will be described. In this case, the data bus DBS, the power supply line LVBUS, and the ground line LGND in FIG. 1 are lines provided in a USB cable. Note that the technique of the present embodiment is also applicable to standards that have evolved from the USB standard, standards based on the same idea as USB, and standards other than USB.

The physical layer circuit 11 includes a pull up resistor RPU, switch elements SW_RPU and SW_DM, and pull down resistors RPD1 and RPD2. The switch element SW_RPU is switched on or off based on a control signal RPU_Enable. Thus a pull up operation is realized. The physical layer circuit 11 includes an HS driver HSD that is a transmission circuit for HS (High Speed), an FS driver FSD that is a transmission circuit for FS (Full Speed), and resistors RS1 and RS2. The HS driver HSD is a current driver that performs current driving, and the FS driver FSD is a voltage driver that performs voltage driving. Note that the FS driver FSD is also used for LS (Low Speed), and is a driver used for both FS and LS. At the time of HS termination, the FS driver FSD outputs an L level signal such that the resistors RS1 and RS2 function as terminating resistors of 45Ω. When the HS termination is disabled, the output of the FS driver FSD is in a high impedance state.

Also, the physical layer circuit 11 includes an HS receiver HSR that is a differential receiving circuit for HS, a transmission envelope detector SQL that is a squelch detection circuit, an FS receiver FSR that is a differential receiving circuit for FS, a decoupling envelope detector DIS that is a decoupling detection circuit, and single end receivers DP_SER and DM_SER that are single end receiving circuits. Note that the FS receiver FSR is also used for LS, and is a receiver used for both FS and LS. The level shifter 18 performs level shifting of various control signals and data signals shown in FIG. 2.

Note that when the physical layer circuit 11 is a circuit conforming to USB, the processing circuit 20 includes a serial/parallel conversion circuit that converts serial data received through USB into parallel data, a parallel/conversion circuit that converts parallel data into serial data, and a circuit corresponding to a link layer of an elastic buffer, an NRZI circuit, or the like. For example, a circuit corresponding to a link layer or the like among USB transceiver macrocells is included in the processing circuit 20, and analog circuits such as a transmission circuit, a receiving circuit, and a detection circuit are included in the physical layer circuit 11.

Figure 3:
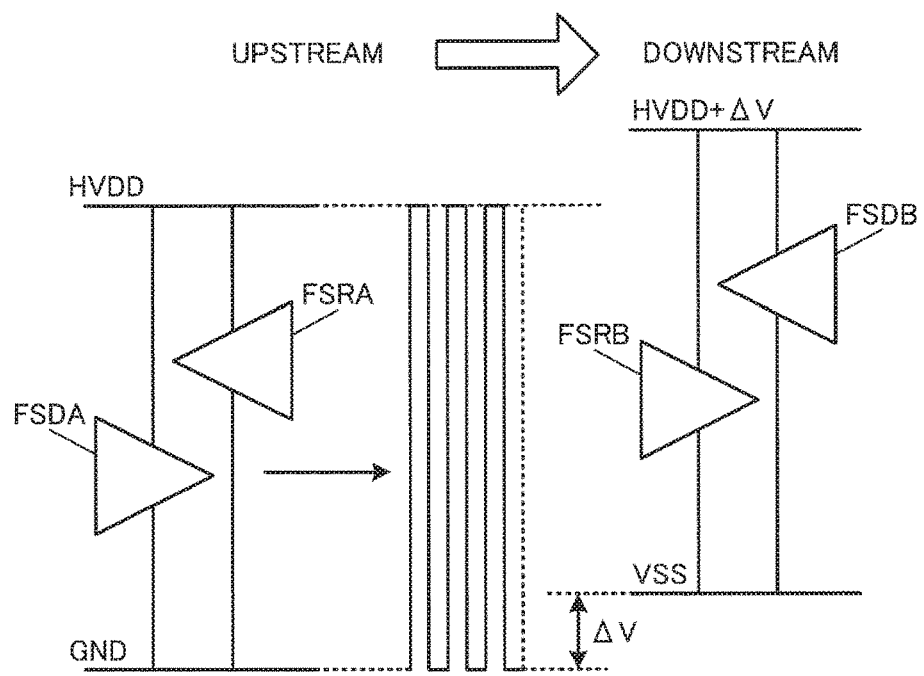
FIG. 3 is an explanatory diagram of a problem regarding a GND shift in an FS mode.
Figure 4:
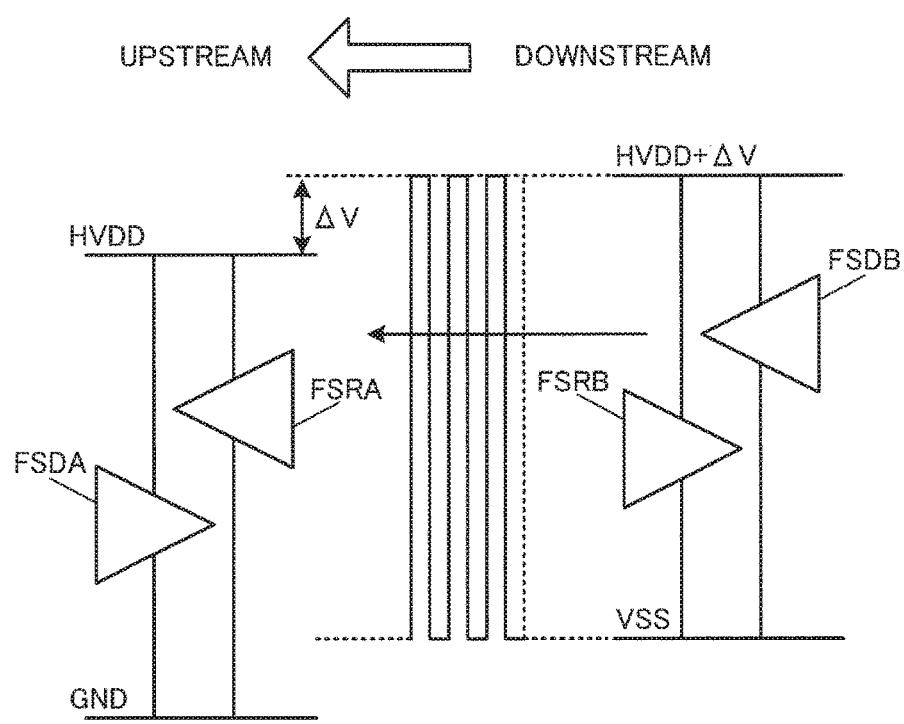
FIG. 4 is an explanatory diagram of the problem regarding the GND shift in the FS mode.

Next, the problem of the GND shift will be described in detail with reference to FIGS. 3 to 6. FIGS. 3 and 4 illustrate the problem of the GND shift in the FS mode. In FIG. 3, an FS driver FSDA on the upstream side transmits a signal, and an FS receiver FSRB on the downstream side receives the signal. In FIG. 4, an FS driver FSDB on the downstream side transmits a signal, and an FS receiver FSRA on the upstream side receives the signal. The upstream side is the circuit device 10 of FIG. 1, and for example, is a USB host. The downstream side is the external device 90 of FIG. 1, and for example, is a USB device. On the upstream side, the potential of the ground line LGND becomes 0 V, which is the GND level. On the other hand, when the current indicated by A2 flows through the parasitic resistance RP in FIG. 1, on the downstream side, the GND shift, in which the potential of the ground line LGND rises from 0 V by ΔV, occurs. When this sort of GND shift occurs, the receiving sensitivity of the FS receiver FSRB decreases. When the voltage range of the transmission signal of the FS driver FSDA greatly shifts from the receivable voltage range of the FS receiver FSRB, a situation occurs in which the FS receiver FSRB cannot properly receive the transmission signal. Also, a problem that the maximum rating of the power supply voltage of the external device 90 is exceeded occurs due to generation of the GND shift of $\Delta V$. For example, when $\Delta V$ becomes about 0.4 V, a diode of a PN junction in the external device 90 switches on and current flows, and when $\Delta V$ exceeds, for example, 0.6 V, a large current flows and a situation occurs in which a guaranteed range is exceeded. A similar problem also occurs when the FS driver FSDB on the upstream side transmits a signal to the FS receiver FSRA on the downstream side as shown in FIG. 4.

Figure 5:
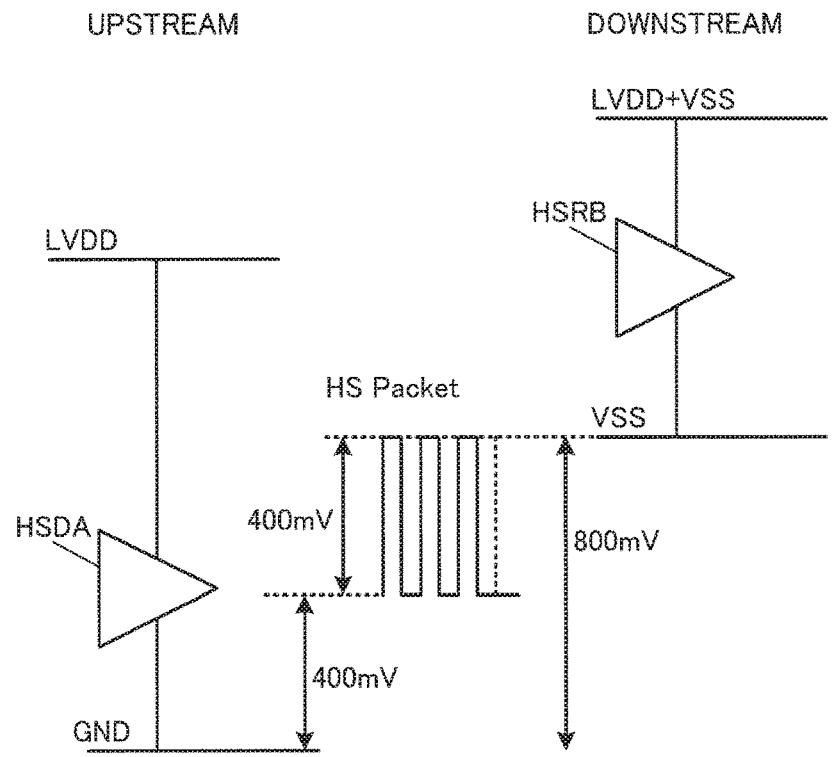
FIG. 5 is an explanatory diagram of a problem regarding the GND shift in an HS mode.
Figure 6:
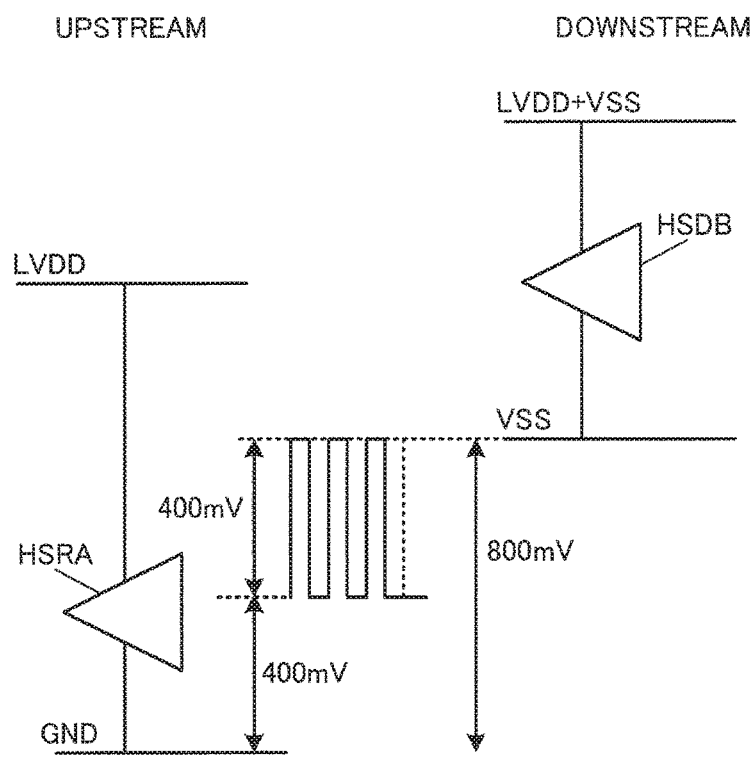
FIG. 6 is an explanatory diagram of the problem regarding the GND shift in the HS mode.

FIGS. 5 and 6 illustrate the problem of the GND shift in the HS mode. In FIG. 5, an HS driver HSDA on the upstream side transmits a signal, and an HS receiver HSRB on the downstream side receives the signal. In FIG. 6, an HS driver HSDB on the downstream side transmits a signal, and an HS receiver HSRA on the upstream side receives a signal. In this case, when the GND shift occurs, the receiving sensitivity of the HS receiver HSRA greatly decreases, and as a result, problems occur such as a communications error in which a signal cannot be properly received, or a maximum rating is exceeded. For example, in FIG. 5, the HS driver HSDA, with reference to a voltage of 400 mV from the GND, transmits an HS packet signal having a signal amplitude of 400 mV. In FIG. 5, the GND shift of $\Delta V$=800 mV occurs, so the voltage range of the HS packet signal from the HS driver HSDA does not fall within the receivable voltage range of the HS receiver HSRB. Therefore, the HS receiver HSRB cannot properly receive the HS packet signal, and a communications error occurs.

Particularly with USB, the power supply power of the voltage VBUS at the time of charging a battery rises, and in the specifications of BC 1.2, it is possible to charge with a large current such as 1.5 A, for example. Therefore, when such a large current flows at the voltage VBUS, the $\Delta V$ in the GND shift increases. Further, in an in-vehicle device or the like, the cable 130 in FIG. 15 described later becomes long, so the parasitic resistance RP in FIG. 1 becomes large, and $\Delta V$ also increases with this. When $\Delta V$ increases, as described in FIGS. 3 to 6, problems such as a communications error or exceeding a maximum rating occur.

In this regard, in the present embodiment, the physical layer circuit 11 operates by the power supply system of the voltages VSSA to HVDDA independent of the power supply system by the ground line LGND. For example, a large current such as a charging current does not flow through the USB cable to the power supply line LVSSA, and only the current consumption in the physical layer circuit 11 flows. Therefore, it is possible to effectively prevent the occurrence of problems caused by the GND shift as described with reference to FIGS. 3 to 6.

2. Detailed Configuration Example

Figure 7:
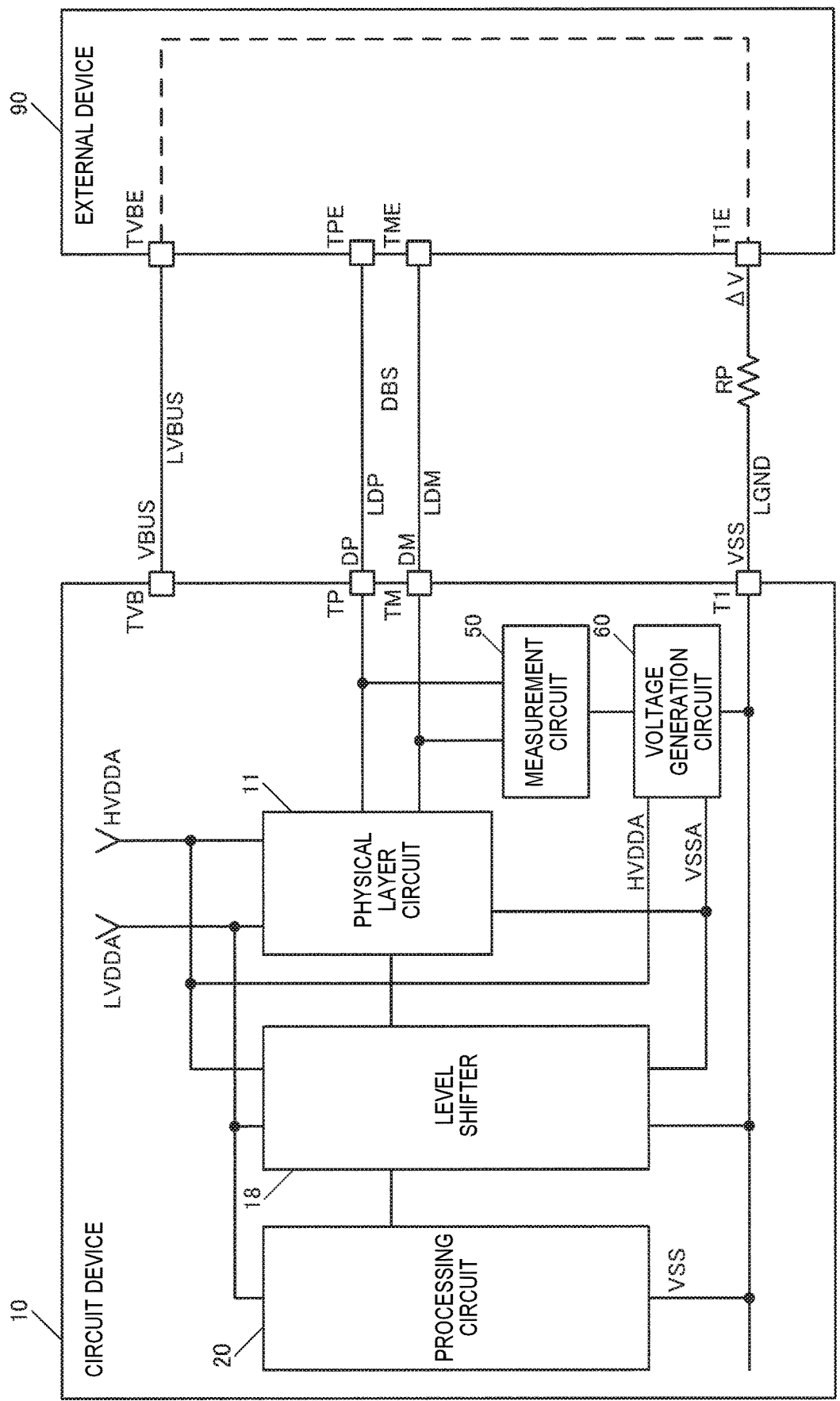
FIG. 7 shows a detailed first configuration example of the circuit device of the present embodiment.

FIG. 7 shows a detailed first configuration example of the circuit device 10 of the present embodiment. In FIG. 7, the circuit device 10 includes a measurement circuit 50 and a voltage generation circuit 60. The measurement circuit 50 measures the voltage of the data bus DBS. For example, the voltage of the signal line LDP serving as the DP signal line, or the voltage of the signal line LDM serving as the DM signal line, is measured. Note that the voltages of both the signal line LDP and the signal line LDM may be measured. In this case, for example, an average value of the two measured voltages may be used as the measurement voltage serving as the measurement result. In this way, the measurement circuit 50 measures the voltage of at least one of the signal line LDP and the signal line LDM. Note that the DP signal line is a signal line that transmits a USB DP signal, and the DM signal line is a signal line that transmits a USB DM signal.

The voltage generation circuit 60 generates the power supply voltage VSSA serving as the first power supply voltage based on the measurement result of the measurement circuit 50. The voltage generation circuit 60 generates the power supply voltage HVDDA serving as the second power supply voltage with reference to the generated power supply voltage VSSA. The physical layer circuit 11 operates by being supplied with the power supply voltages VSSA and HVDDA, and performs signal transmission and signal receiving in the HS mode, the FS mode, or the LS mode.

Figure 8:
FIG. 8 illustrates operation of the present embodiment.

FIG. 8 illustrates operation of the present embodiment. On the external device 90 side, the GND shift of $\Delta V$ occurs. In this case, the circuit device 10 generates, as the power supply voltage VSSA, a voltage that is shifted by $\Delta V$ from the power supply voltage VSS of the ground line LGND. Specifically, $\Delta V$ is measured by the measurement circuit 50 measuring the voltage of the data bus DBS. The voltage generation circuit 60 generates the power supply voltage VSSA based on the measured $\Delta V$. For example, the power supply voltage VSSA is generated such that VSSA=VSS+$\Delta V$. Also, the voltage generation circuit 60 generates the power supply voltage HVDDA based on the power supply voltage VSSA. For example, as shown in FIG. 8, the power supply voltage HVDDA is generated with reference to the power supply voltage VSSA such that a relationship HVDDA=VSSA+(HVDD−VSS) is established. That is, a voltage of (HVDD×VSS) is added in an analog manner to the power supply voltage VSSA to generate the power supply voltage HVDDA. For example, HVDD−VSS is a power supply voltage range in the physical layer circuit of the external device 90, and is, for example, a voltage range of 3.3 V. In the present embodiment, a configuration is adopted such that a relationship HVDDA−VSSA=HVDD−VSS is established.

By adopting this sort of configuration, by measuring the voltage of the data bus DBS, it is possible to generate the power supply voltages VSSA and HVDDA by measuring $\Delta V$, which is the shift voltage generated by the GND shift. By operating the physical layer circuit 11 based on the generated power supply voltages VSSA and HVDDA, it is possible to prevent the occurrence of problems due to the GND shift described in FIGS. 3 to 6.

Figure 9:
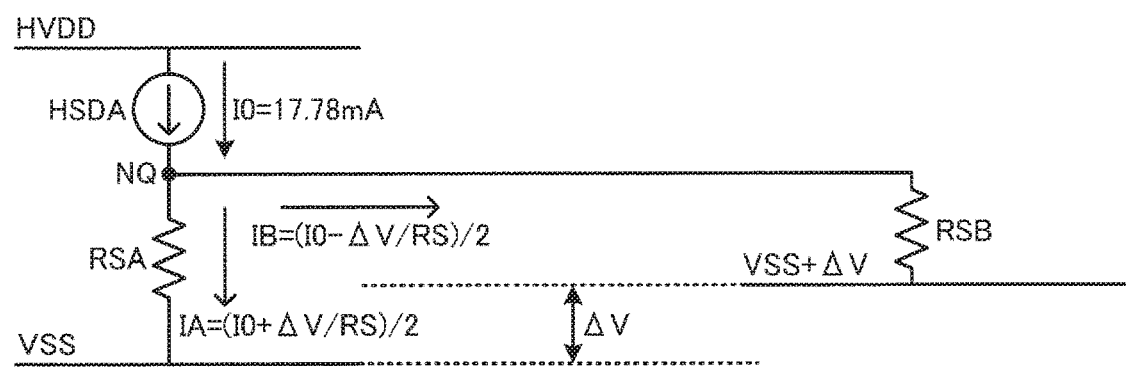
FIG. 9 illustrates a measurement technique of a measurement circuit.

FIG. 9 illustrates the measurement technique of the measurement circuit 50 in the HS mode. For example, in the present embodiment, the physical layer circuit 11 of the circuit device 10 includes the HS driver HSDA serving as a USB HS mode transmission circuit. The measurement circuit 50 measures the voltage of the signal line LDP or the signal line LDM of the data bus DBS coupled to the HS driver HSDA.

The HS driver HSDA uses a current source to flow a current of I0=17.78 mA. This current flows through a resistor RSA that is a terminating resistor on the circuit device 10 side and a resistor RSB that is a terminating resistor on the external device 90 side. Here it is assumed that the resistance values of the resistors RSA and RSB are RS=45Ω, and a voltage shift of $\Delta V$ occurs due to the GND shift. In this case, the current that flows through the resistor RSA is IA=(I0+$\Delta V$/RS)/2, and the current that flows through the resistor RSA is IB=(I0−$\Delta V$/RS)/2.

When the GND shift is not occurring, a voltage VNQ of an output node NQ of the signals DP and DM, which is a coupling node between the HS driver HSDA and the resistors RSA and RSB, becomes VNQ=17.78 mA×22.5 Ω=400 mV. On the other hand, when the GND shift occurs, the current that flows through the resistor RSA becomes IA= (I0+ΔV/RS)/2, so the voltage of the output node NQ rises from VNQ=400 mV to VNQ=400 mV+ΔV/2. Therefore, ΔV/2 can be measured by measuring the voltage of the data bus DBS where the signals DP and DM are output, and ΔV that is the shift voltage due to the GND shift can be calculated. That is, by measuring the voltage of the signal line LDP or the signal line LDM in the HS mode, ΔV/2 can be measured and so ΔV can be measured. By the measurement circuit 50 measuring ΔV in this manner, as shown in FIG. 8, the voltage generation circuit 60 can generate the power supply voltage VSSA=VSS+ΔV, and the power supply voltages VSSA and HVDDA can be supplied to the physical layer circuit 11.

Figure 10:
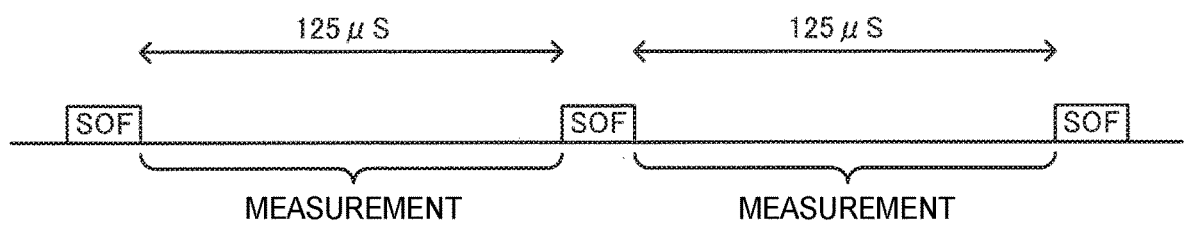
FIG. 10 illustrates measurement timing of the measurement circuit.

In this case, the measurement circuit 50 measures the voltage of the signal line LDP or the signal line LDM during a period when USB packets are not being communicated. For example, as shown in FIG. 10, during an HS idle period, an SOF (Start of Frame) packet is transmitted every 125 μs and sent from the host on the upstream side to the device on the downstream side. Therefore, in this case, as shown in FIG. 10, during a period when a SOF packet, which is a USB packets, is not being communicated, the voltage of the signal line LDP or the signal line LDM is measured and ΔV, which is the shift voltage due to the GND shift, is measured. By adopting this sort of configuration, ΔV can be measured by effectively using a period when a USB packet is not being communicated, and it is possible to prevent a situation in which the measurement by the measurement circuit 50 affects USB packet communications.

Figure 11:
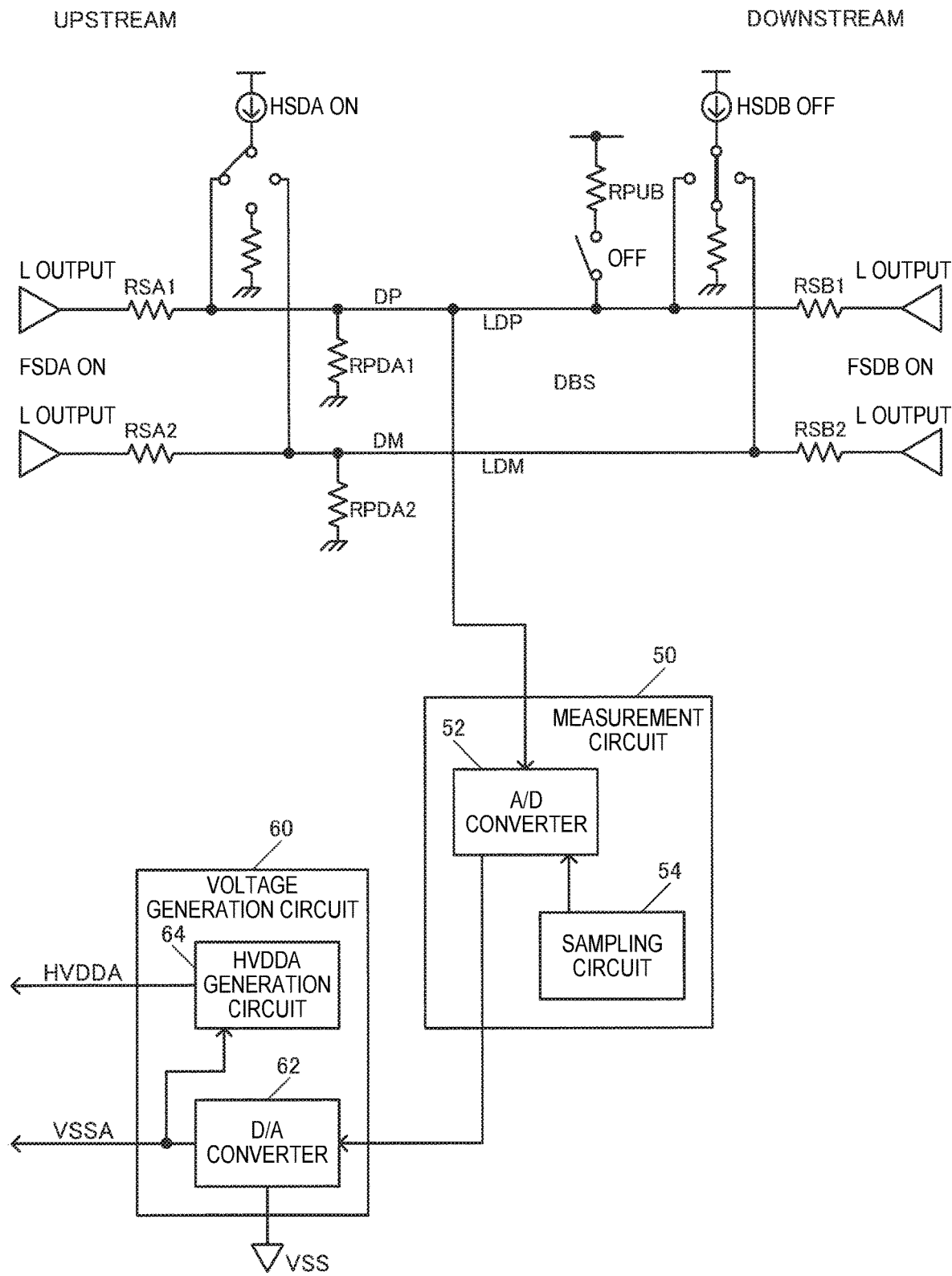
FIG. 11 shows a detailed configuration example of the measurement circuit and a voltage generation circuit.

FIG. 11 shows a detailed configuration example of the measurement circuit 50 and the voltage generation circuit 60. FIG. 11 shows an example of measurement in the HS mode, specifically, an example of measurement during an HS idle period. The FS driver FSDA on the upstream side outputs an L level signal, whereby resistors RSA1 and RSA2 function as terminating resistors. Likewise, the FS driver FSDB on the downstream side also outputs an L level signal, whereby resistors RSB1 and RSB2 function as terminating resistors. Note that pull up operation by a pull up resistor RPUB is off. On/off switching of pull up operation by the pull up resistor RPUB can be realized by, for example, switching on and off a switch that couples one end of the pull up resistor RPUB to the signal line LDP. The same is true for on/off switching of pull down operation by a pull down resistor. Also, the HS driver HSDA on the upstream side is on, current from the current source of the HS driver HSDA flows to the resistor RSA1 on the upstream side and the resistor RSB1 on the downstream side, and thus measurement of ΔV as described above is possible.

The measurement circuit 50 includes an A/D converter 52 and a sampling circuit 54. The A/D converter 52, for example, performs A/D conversion of the voltage of the signal line LDP, and outputs digital data corresponding to ΔV for example. Note that FIG. 11 shows an example where the measurement circuit 50 measures the voltage of the signal line LDP, but the measurement circuit 50 may measure the voltage of the signal line LDM. In this case, the A/D converter 52 performs A/D conversion of the voltage of the signal line LDM. Alternatively, the measurement circuit 50 may perform A/D conversion of the voltages of both the signal line LDP and the signal line LDM to measure the voltage. In this case, an average value of the digital data of the measured voltages may be used as the measurement result.

The sampling circuit 54 controls sampling operation of the signal of the A/D converter 52. Specifically, the sampling circuit 54 outputs a sampling clock signal to the A/D converter 52 to control the sampling operation. For example, the sampling circuit 54 controls the A/D converter 52 so as to perform A/D conversion by sampling the signal of the signal line LDP in a period when HS packets are not being communicated. By adopting this sort of configuration, as described in FIG. 10, the voltage of the signal line LDP or the like in a period when HS packets are not being communicated can be measured by the measurement circuit 50.

The voltage generation circuit 60 includes a D/A converter 62 and an HVDDA generation circuit 64. The D/A converter 62 receives digital data corresponding to the ΔV of the GND shift from the A/D converter 52 of the measurement circuit 50. Then, D/A conversion of the received digital data is performed to generate and output the power supply voltage VSSA satisfying VSSA=VSS+ΔV. The HVDDA generation circuit 64 generates and outputs a power supply voltage HVDDA on the high potential side with reference to the power supply voltage VSSA, based on the power supply voltage VSSA on the low potential side from the D/A converter 62. The HVDDA generation circuit 64 can be realized by an operational amplifier, a resistance element, or the like that outputs the power supply voltage HVDDA based on the power supply voltage VSSA.

According to the measurement circuit 50 and the voltage generation circuit 60 of FIG. 11, by measuring the voltage of the data bus DBS during an HS idle period, ΔV, which is the shift voltage of the GND shift, is obtained, and thus it is possible to generate the power supply voltages VSSA and HVDDA having a potential relationship as shown in FIG. 8, and supply these to the physical layer circuit 11.

Figure 12:
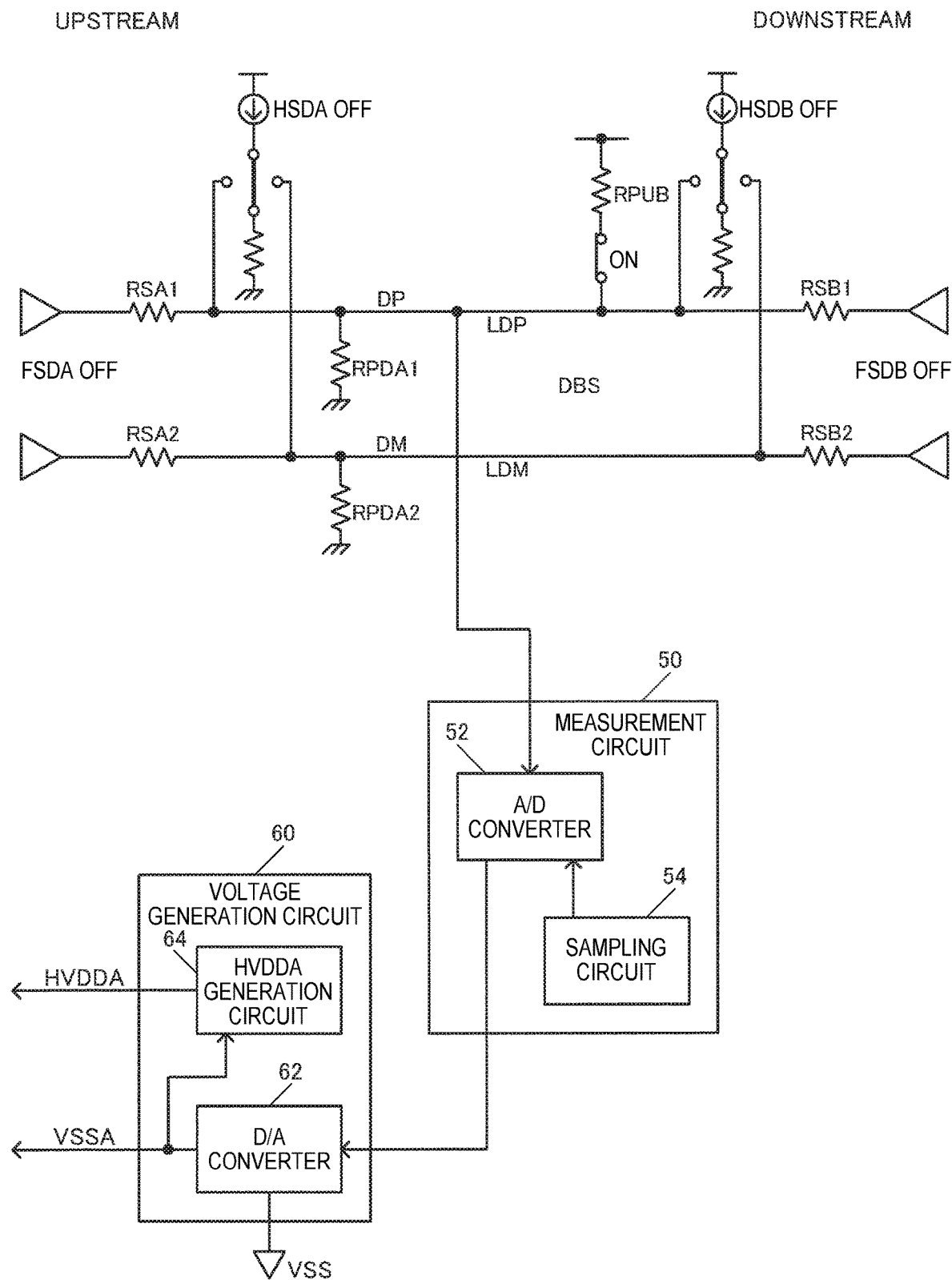
FIG. 12 shows a detailed configuration example of the measurement circuit and the voltage generation circuit.

Note that it is also possible to measure ΔV, which is the shift voltage of the GND shift, in the FS mode or the LS mode. For example, in FIG. 12, the FS driver FSDA and the FS driver FSDB are off, and the HS driver HSDA and the HS driver HSDB are also off. Pull up operation by the pull up resistor RPUB on the downstream side is on. Specifically, switching that couples one end of the pull up resistor RPUB to the signal line LDP is on. On the upstream side, the signal line LDP is pulled down by the pull down resistor RPDA1. Note that a configuration may also be adopted in which, when measuring the voltage of the signal line LDM, on the downstream side, pull up operation by the pull up resistor for the signal line LDM is switched on, and on the upstream side, the pull down operation by the pull down resistor for the signal line LDM is switched on. Switching on/off of the pull down operation by the pull down resistor can be realized, for example, by switching on/off a switch that couples one end of a pull down resistor to the signal line LDM.

For example, the other end of the pull up resistor RPUB is coupled to a power supply node of 3.3 V, the resistance value of the pull up resistor RPUB is 1.5 KΩ, and the resistance value of the pull down resistor RPDA1 is 15 KΩ. Therefore, when the GND shift of ΔV has occurred, the voltage VLDP of the signal line LDP is VLDP=(3.3 V+ΔV)× {15 KΩ/(15 KΩ+1.5 KΩ)}. Therefore, by measuring the voltage VLDP with the measurement circuit 50, it is possible to measure ΔV due to the GND by inverse calculation. For example, the measurement circuit 50 calculates ΔV by performing arithmetic processing on the A/D conversion result of the A/D converter 52. The voltage generation circuit 60 generates the power supply voltages VSSA and HVDDA based on the calculated ΔV, and supplies this to the physical layer circuit 11. The configurations of the measurement circuit 50 and the voltage generation circuit 60 are the same as those in FIG. 11, so a detailed description thereof will be omitted.

Figure 13:
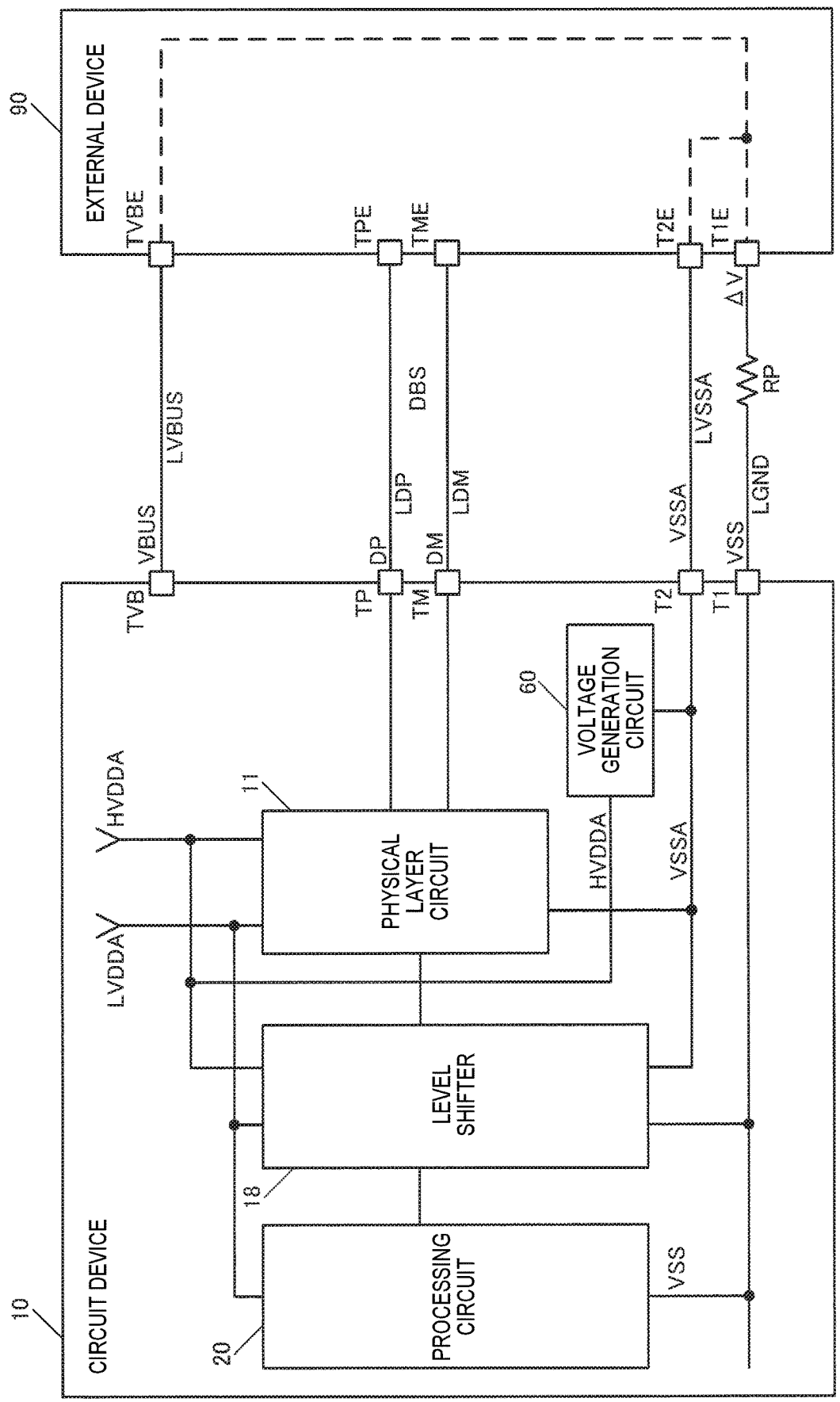
FIG. 13 shows a detailed second configuration example of the circuit device of the present embodiment.

FIG. 13 shows a detailed second configuration example of the circuit device 10 of the present embodiment. In FIG. 13, the circuit device 10 includes a terminal T1 coupled to the ground line LGND, and a terminal T2 coupled to the power supply line LVSSA that supplies the power supply voltage VSSA. The power supply voltage VSSA is a first power supply voltage, the power supply line LVSSA is a first power supply line, the terminal T1 is a first terminal, and the terminal T2 is a second terminal. The physical layer circuit 11 operates based on the power supply voltage VSSA supplied from outside of the circuit device 10 to the terminal T2 through the power supply line LVSSA. For example, the power supply line LVSSA is electrically coupled to the ground line LGND by internal wiring of the external device 90. For example, a terminal T2E of the external device 90 coupled to the power supply line LVSSA and a terminal T1E of the external device 90 coupled to the ground line LGND are coupled by the internal wiring of the external device 90. Therefore, when the GND shift occurs on the external device 90 side, the power supply voltage VSSA at which VSSA=VSS+ΔV is transmitted to the circuit device 10 through the power supply line LVSSA. That is, in the external device 90, when the potential of the ground line LGND increases by ΔV from 0 V due to the GND shift, this potential increase is transmitted to the power supply line LVSSA coupled to the ground line LGND by the internal wiring of the external device 90, and is also transmitted to the circuit device 10. Thus, as shown in FIG. 8, the power supply voltage VSSA at which VSSA=VSS+ΔV is supplied as the power supply voltage on the low potential side to operate the physical layer circuit 11. As a result, it is possible to prevent the occurrence of a problem such as a communications error due to the GND shift described with reference to FIGS. 3 to 6.

In this way, in the second configuration example of FIG. 13, there is an advantage that with a simple configuration of providing the terminal T2 for the power supply line LVSSA for transmitting the power supply voltage VSSA=VSS+ΔV from the external device 90, occurrence of a problem due to the GND shift can be prevented. For example, a large current such as a charging current flows through the power supply line LVBUS and the ground line LGND, and due to that large current flowing through the parasitic resistance RP, the ΔV due to the GND shift increases, and a problem as described in FIGS. 3 to 6 occurs. On the other hand, in the configuration shown in FIG. 13, only the current consumption in the physical layer circuit 11 flows through the power supply line LVSSA, and this consumption current is much smaller than the large current such as a charging current, so the GND shift problem substantially does not occur and can be ignored.

Also, in FIG. 13, the circuit device 10 includes the voltage generation circuit 60 that generates the power supply voltage HVDDA with reference to the power supply voltage VSSA supplied to the terminal T2. The voltage generation circuit 60 generates the power supply voltage HVDDA with a potential relationship as shown in FIG. 8. That is, the voltage generation circuit 60 adds a voltage of (HVDD−VSS) in an analog manner to the power supply voltage VSSA, so as to satisfy HVDDA=VSSA+(HVDD−VSS), to generate the power supply voltage HVDDA. The voltage generation circuit 60 can be realized by, for example, an operational amplifier, a resistance element, or the like to which the power supply voltage VSSA is input, and that outputs the power supply voltage HVDDA. By adopting this sort of configuration, it is possible to properly operate the physical layer circuit 11 by supplying, with reference to the power supply voltage VSSA, a power supply voltage in the power supply voltage range of the voltages HVDDA to VSSA, corresponding to the voltages HVDD to VSS, to the physical layer circuit 11.

Figure 14:
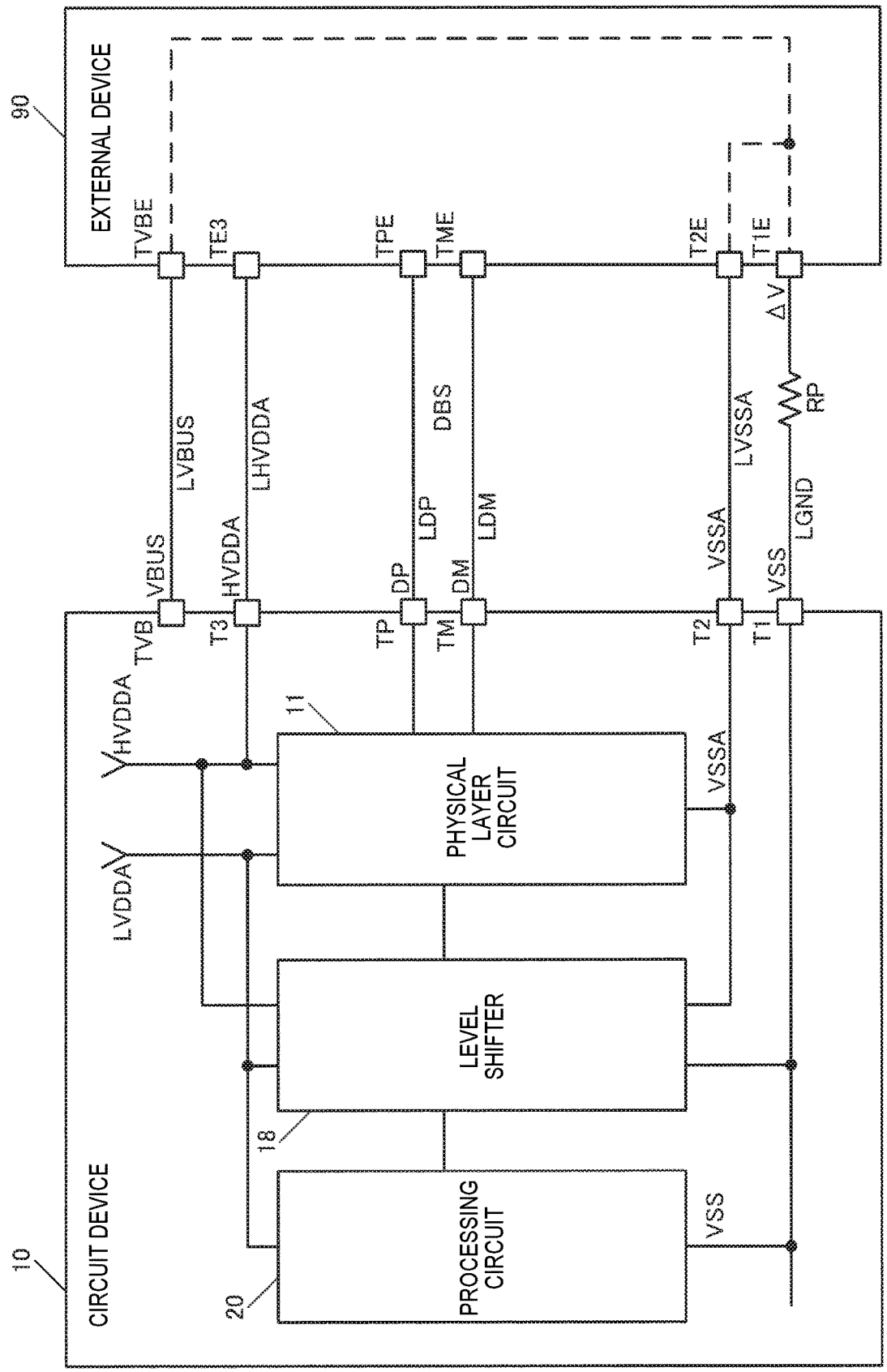
FIG. 14 shows a detailed third configuration example of the circuit device of the present embodiment.

FIG. 14 shows a detailed third configuration example of the circuit device 10 of the present embodiment. In FIG. 14, the circuit device 10 includes a terminal T3 coupled to a power supply line LHVDDA that supplies the power supply voltage HVDDA. The power supply voltage HVDDA is a second power supply voltage, the power supply line LHVDDA is a second power supply line, and the terminal T3 is a third terminal. The physical layer circuit 11 operates based on the power supply voltage HVDDA supplied from outside of the circuit device 10 to the terminal T3 through the power supply line LHVDDA. For example, the power supply line LHVDDA couples the terminal T3 of the circuit device 10 and a terminal TE3 of the external device 90. The external device 90 supplies the power supply voltage HVDDA to the circuit device 10 through the terminal TE3 and the power supply line LHVDDA. Thus, the physical layer circuit 11 can operate based on the power supply voltage VSSA on the low potential side supplied from the external device 90 through the power supply line LVSSA and the terminal T2, and the power supply voltage HVDDA on the high potential side supplied from the external device 90 through the power supply line LHVDDA and the terminal T3. Therefore, even if the shift voltage ΔV increases due to the GND shift, the physical layer circuit 11 can output a signal in the voltage range where the physical layer circuit of the external device 90 can properly receive the signal, so occurrence of a problem due to the GND shift can be prevented. Also, in the third configuration example shown in FIG. 14, there is an advantage that it is not necessary for the circuit device 10 to have the voltage generation circuit 60 as in the second configuration example in FIG. 13.

Note that in FIGS. 13 and 14, the power supply line LVBUS, the data bus DBS, and the ground line LGND are included in the USB cable, but the power supply line LVSSA and the power supply line LHVDDA are not defined by the USB specification, and are power supply lines not included in the USB cable. Therefore, in the second and third configuration examples of FIGS. 13 and 14, there is a disadvantage that it is necessary to separately prepare a special cable having the power supply line LVSSA and the power supply line LHVDDA. In this regard, in the first configuration example shown in FIG. 7, there are the advantages that it is not necessary to prepare such a special cable, and the circuit device 10 and the external device 90 can be coupled using an ordinary USB cable. On the other hand, in the second and third configuration examples of FIGS. 13 and 14, there are the advantages that it is only necessary to provide the terminal T2 and the terminal T3 in the circuit device 10, and it is not necessary to provide the measurement circuit 50 or the like shown in FIG. 7.

Figure 15:
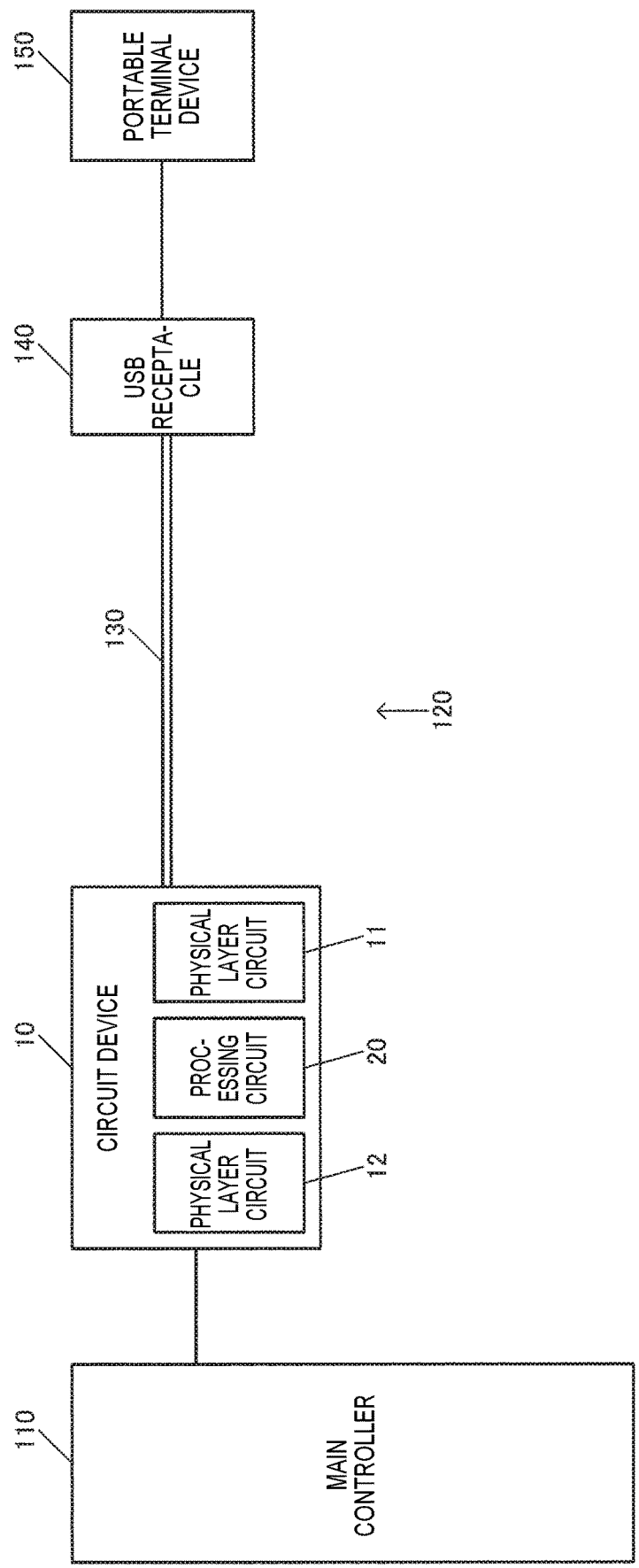
FIG. 15 shows an example of application of the circuit device of the present embodiment to an in-vehicle device.

FIG. 15 shows an example of application of the circuit device 10 of the present embodiment to an in-vehicle device. A main controller 110 is a host on the upstream side, and is realized by an SOC (System-On-a-Chip), for example. A portable terminal device 150 such as a smartphone on the downstream side is coupled to the main controller 110 through a cable 130 and a USB receptacle 140. Also, a Bluetooth (registered trademark) device and an SD card device are coupled to the downstream side of the main controller 110. In FIG. 15, the circuit device 10 is provided between the cable 130 and the USB receptacle 140, and the main controller 110. The cable harness 120 can be configured with the circuit device 10 of the present embodiment, the cable 130, and the like. Note that a charging circuit, an electrostatic protection circuit, and the like that are not shown can be provided between the main controller 110 and the USB receptacle 140.

In the vehicle-mounted device, the cable 130 becomes very long, and for example, in some instances may be as long as 5 m to 10 m. When the cable length becomes long, the parasitic resistance RP in FIG. 1 becomes large and ΔV due to the GND shift becomes large, causing the problem described in FIGS. 3 to 6. In this regard, in the present embodiment, the circuit device 10 is coupled to one end of the cable 130 having a long cable length, and the USB receptacle 140 is coupled to the other end of the cable 130. A user couples the portable terminal device 150 to the USB receptacle 140 with an ordinary USB cable.

In the circuit device 10 of the present embodiment, as described with reference to FIGS. 1, 7, 13, and 14, the physical layer circuit 11 operates based on the power supply voltage VSSA on the low potential side differing from the power supply voltage VSS of the ground line LGND, and the power supply voltage HVDDA on the high potential side set with reference to the power supply voltage VSSA. Therefore, it is possible to make the voltage range of the signal of the physical layer circuit 11 of the circuit device 10 substantially the same as the receivable voltage range of the signal of the physical layer circuit of the portable terminal device 150 serving as the external device 90. Thus, even when ΔV increases due to the GND shift, it is possible to prevent occurrence of a communications error, and possible to prevent occurrence of a situation where a maximum rating is exceeded.

Note that in the circuit device 10 of FIG. 15, the physical layer circuit 11 is provided on the downstream side, and a physical layer circuit 12 is also provided on the upstream side. The processing circuit 20 is provided between the physical layer circuit 11 and the physical layer circuit 12. The circuit device 10 is coupled to the portable terminal device 150 through a first bus to which the physical layer circuit 11 is coupled, and is coupled to the main controller 110 through a second bus to which the physical layer circuit 12 is coupled. Note that the level shifter 18 as shown in FIG. 1 is provided between the physical layer circuit 11 and the processing circuit 20. Also, a level shifter may be provided between the physical layer circuit 12 and the processing circuit 20. The processing circuit 20 performs a packet repeat operation similar to a processing circuit of a USB hub. For example, the processing circuit 20 performs processing that transmits a repeat packet of a packet received by the physical layer circuit 12 from the main controller 110 to the portable terminal device 150 by the physical layer circuit 11. Also, the processing circuit 20 performs processing that transmits a repeat packet of a packet received by the physical layer circuit 11 from the portable terminal device 150 to the main controller 110 by the physical layer circuit 12. By adopting this sort of configuration, even when the cable length of the cable 130 is long, it is possible to realize a packet transmission/receiving processing in which the influence of the GND shift is kept to a minimum.

Note that in FIG. 15, an unshown charging circuit that supplies VBUS power can be provided instead of the main controller 110. Specifically, for example, it is possible to provide a charging circuit that performs operation conforming to the specifications of USB BC 1.2. In BC 1.2, for example, a VBUS power supply limit of 500 mA or less is expanded to be, for example, 2 A or less. The charging circuit has a regulator circuit or the like, and an external power supply is supplied to supply VBUS power. In BC 1.2, in a charging mediation period after a bus reset, the charging circuit performs signal transfer using the signals DP and DM between the charging circuit and a peripheral device such as the portable terminal device 150, and the protocol of BC 1.2 is executed to perform charging arbitration processing. After the arbitration processing, an ordinary USB signal sequence following the bus reset is executed. In a case where such a charging circuit is provided, VBUS power supply is performed not by the main controller 110 or the circuit device 10, but by the charging circuit.

3. Electronic Device and Mobile Body

Figure 16:
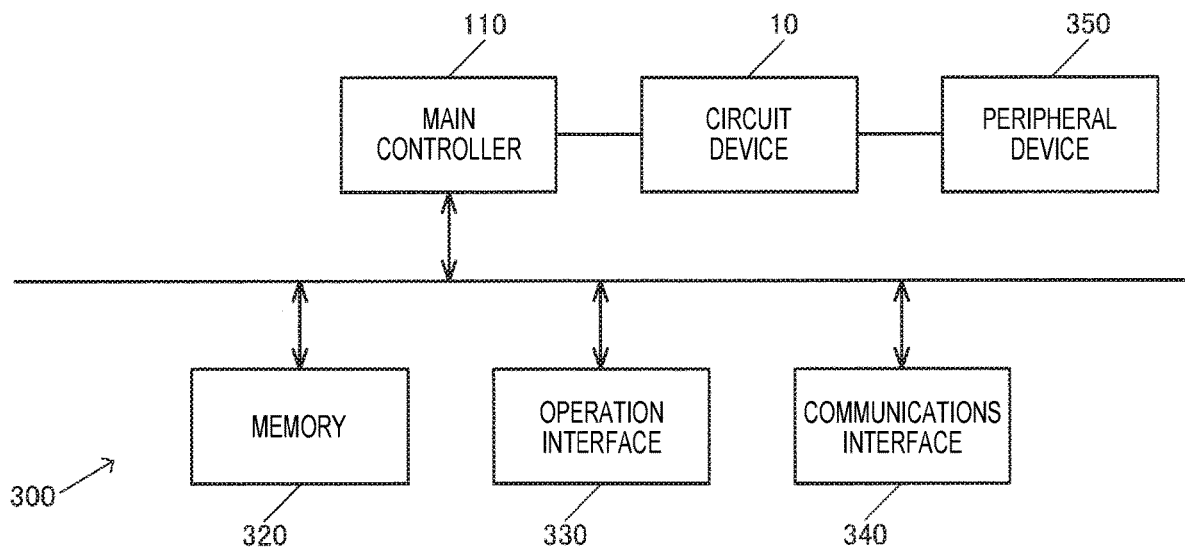
FIG. 16 shows a configuration example of an electronic device.

FIG. 16 shows a configuration example of an electronic device 300 including the circuit device 10 of the present embodiment. The electronic device 300 includes the circuit device 10 of the present embodiment, and the main controller 110 serving as a processing device. The circuit device 10 is coupled to a peripheral device 350 such as the portable terminal device 150 through a first bus, and is coupled to the main controller 110 through a second bus.

The main controller 110 performs control processing of the electronic device 300, various signal processing, and the like. The main controller 110 can be realized, for example, by a processor such as a CPU or an MPU. Alternatively, the main controller 110 may be realized by an ASIC (Application Specific Integrated Circuit). Also, the main controller 110 may be realized by a circuit board where a plurality of ICs (Integrated Circuits) and circuit components are mounted. As the peripheral device 350, for example, the portable terminal device 150 as shown in FIG. 15 or the like can be assumed, but the peripheral device 350 is not limited to this. The peripheral device 350 may be a wearable device or the like.

The electronic device 300 can further include a memory 320, an operation interface 330, and a communications interface 340. The memory 320 stores, for example, data from the operation interface 330 and the communications interface 340, or alternatively functions as a work memory of the main controller 110. The memory 320 can be realized by a semiconductor memory such as a RAM (Random Access Memory) or a ROM (Read Only Memory), or a magnetic storage device such as a hard disk drive. The operation interface 330 is a user interface that accepts various operations from a user. For example, the operation interface 330 can be realized by various buttons, a touch panel, or the like. The communications interface 340 is an interface that performs communications of various data such as control data and image data. The communications processing of the communications interface 340 may be wired communications processing, or may be wireless communications processing.

Specific examples of the electronic device 300 include various electronic devices, such as in-vehicle devices such as a car navigation device, an in-vehicle audio device or an instrument panel, or a projector, a head mounted display, a printing device, a portable information terminal, a portable game terminal, a robot, or alternatively an information processing device or the like. Alternatively, the electronic device 300 may be a biological information measurement device, a measurement device that measures physical quantities such as distance, time, flow rate or flow amount, a network-related device such as a base station or a router, a content providing device that distributes content, or alternatively may be a video device such as a digital camera or a video camera.

Figure 17:
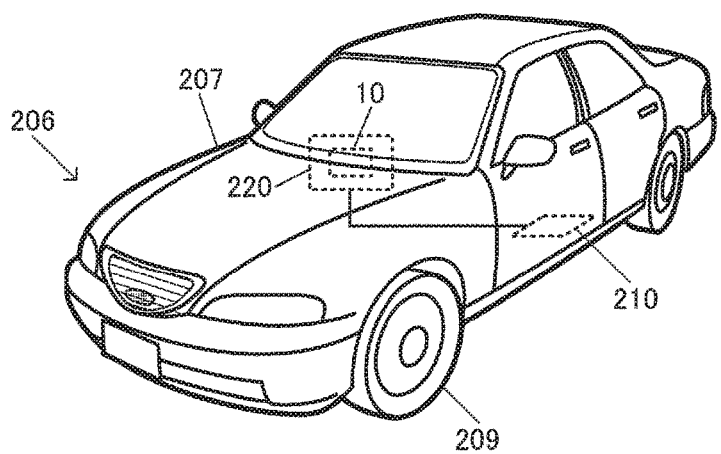
FIG. 17 shows a configuration example of a mobile body.

FIG. 17 shows a configuration example of a mobile body including the circuit device 10 of the present embodiment. The mobile body is, for example, a device or apparatus that moves on the ground, in the sky, or the sea, and is equipped with a drive mechanism such as an engine or a motor, a steering mechanism such as a steering wheel or a rudder, and various electronic devices. As the mobile body of the present embodiment, it is possible to assume, for example, a car, an airplane, a motorcycle, a ship, or alternatively a robot or the like. FIG. 17 schematically shows an automobile 206 as a specific example of the mobile body. The automobile 206 has a vehicle body 207 and wheels 209. The automobile 206 includes an in-vehicle device 220 having the circuit device 10, and a control device 210 controlling each part of the automobile 206. The control device 210 can include, for example, an ECU (Electronic Control Unit) or the like. The circuit device 10 of the present embodiment may be provided in the control device 210. The in-vehicle device 220, for example, is a car navigation device, an in-vehicle audio device, or alternatively a panel device such as an instrument panel, or the like.

As described above, the circuit device of the present embodiment includes a physical layer circuit coupled to a data bus, and a processing circuit that controls the physical layer circuit and performs communications processing through the data bus. The processing circuit operates with a voltage supplied from a ground line as a power supply voltage on a low potential side, and the physical layer circuit operates based on a first power supply voltage on the low potential side supplied from a first power supply line not coupled to the ground line in the circuit device, and a second power supply voltage on a high potential side set with reference to the first power supply voltage.

According to the present embodiment, the physical layer circuit coupled to the data bus is controlled by the processing circuit to perform communications through the data bus. The processing circuit operates with the voltage supplied from the ground line as the power supply voltage on the low potential side. On the other hand, the physical layer circuit operates based on the first power supply voltage on the low potential side supplied from the first power supply line, and the second power supply voltage on the high potential side set with reference to the first power supply voltage. The first power supply line that supplies the first power supply voltage to the physical layer circuit, and the ground line that supplies the power supply voltage to the processing circuit, are not coupled in the circuit device. By adopting this sort of configuration, even when a GND shift occurs in the ground line, it is possible to prevent this GND shift from affecting the power supply voltage that operates the physical layer circuit. Therefore, even when the GND shift occurs, it is possible to properly operate the physical layer circuit, and it is possible to prevent the occurrence of problems caused by the GND shift.

The circuit device of the present embodiment may further include a level shifter that is provided between the physical layer circuit and the processing circuit, and shifts the signal level of a signal from the processing circuit to the physical layer circuit and the signal level of a signal from the physical layer circuit to the processing circuit.

By adopting this sort of configuration, even when the physical layer circuit is operated by the first and second power supply voltages, it is possible to transmit a signal from the processing circuit to the physical layer circuit at an appropriate signal level, and possible to transmit a signal from the physical layer circuit to the processing circuit at an appropriate signal level.

The circuit device of the present embodiment may further include a measurement circuit that measures the voltage of the data bus, and a voltage generation circuit that generates the first power supply voltage based on a measurement result of the measurement circuit, and generates the second power supply voltage with reference to the generated first power supply voltage.

By adopting this sort of configuration, a shift voltage generated by a GND shift can be measured by the measurement circuit, and the first and second power supply voltages can be generated by the voltage generation circuit. Also, by operating the physical layer circuit based on the generated first and second power supply voltages, it is possible to prevent the occurrence of problems caused by the GND shift.

Also, in the circuit device of the present embodiment, a configuration may be adopted in which the physical layer circuit includes an HS driver serving as a USB HS mode transmission circuit, the data bus includes a DP signal line that transmits a USB signal DP and a DM signal line that transmits a USB signal DM, and the measurement circuit measures the voltage of at least one of the DP signal line and the DM signal line of the data bus coupled to the HS driver.

By adopting this sort of configuration, by measuring the voltage of at least one of the DP signal line and the DM signal line coupled to the HS driver in the HS mode, the shift voltage generated by the GND shift can be measured by the measurement circuit.

Also, in the circuit device of the present embodiment, the measurement circuit may measure the voltage of the DP signal line or the DM signal line in a period when a USB packet is not being communicated.

By adopting this sort of configuration, it is possible to measure the shift voltage due to the GND shift by effectively utilizing the period when a USB packet is not being communicated, so it is possible to prevent a situation in which the measurement by the measurement circuit affects USB packet communications.

Also, in the circuit device of the present embodiment, a configuration may be adopted in which the circuit device of the present embodiment includes a first terminal coupled to the ground line and a second terminal coupled to the first power supply line that supplies the first power supply voltage, and the physical layer circuit operates based on the first power supply voltage supplied from outside of the circuit device to the second terminal through the first power supply line.

By adopting this sort of configuration, it is possible to supply the first power supply voltage from outside of the circuit device to the circuit device through the second terminal, and operate the physical layer circuit based on the first power supply voltage, so it is possible to prevent the occurrence of problems caused by the GND shift.

Also, the circuit device of the present embodiment may include a voltage generation circuit that generates the second power supply voltage with reference to the first power supply voltage supplied to the second terminal.

By adopting this sort of configuration, it is possible to generate the second power supply voltage with reference to the first power supply voltage supplied to the second terminal, and supply the second power supply voltage to the physical layer circuit.

Also, in the circuit device of the present embodiment, a configuration may be adopted in which the circuit device includes a third terminal coupled to a second power supply line that supplies the second power supply voltage, and the physical layer circuit operates based on the second power supply voltage supplied from outside of the circuit device to the third terminal through the second power supply line.

By adopting this sort of configuration, in addition to the first power supply voltage, it is possible to supply the second power supply voltage from outside of the circuit device to the circuit device through the third terminal, and operate the physical layer circuit based on the first and second power supply voltages, so it is possible to prevent the occurrence of problems caused by the GND shift.

Also, an electronic device of the present embodiment may include the above-described circuit device. Also, a mobile body of the present embodiment may include the above-described circuit device.

Note that although the present embodiment has been described in detail above, it will be easily understood by those skilled in the art that many modifications that do not substantially deviate from novel matters and effects of the disclosure are possible. Accordingly, all such modifications are encompassed by the disclosure. For example, in the specification or the drawings, a term described at least once together with a different term having a broader or equivalent meaning can be replaced with the different term at any point in the specification or the drawings. Also, all combinations of the present embodiment and modifications are encompassed by the disclosure. Also, the configuration, operation, and the like of the circuit device, the electronic device, and the mobile body are not limited to those described in the present embodiment, and various modified embodiments are possible.

What is claimed is:

1. A circuit device, comprising:
a physical layer circuit coupled to a data bus;
a processing circuit that controls the physical layer circuit and performs communications processing through the data bus, wherein
the processing circuit operates with a voltage of a ground line as a power supply voltage on a low potential side, and
the physical layer circuit operates based on a first power supply voltage on the low potential side supplied from a first power supply line not coupled to the ground line in the circuit device, and a second power supply voltage on a high potential side set with reference to the first power supply voltage;
a measurement circuit that measures the voltage of the data bus; and
a voltage generation circuit that generates the first power supply voltage based on a measurement result of the measurement circuit, and generates the second power supply voltage with reference to the generated first power supply voltage.

2. The circuit device according to claim 1, comprising:
a level shifter that shifts the signal level of a signal from the processing circuit to the physical layer circuit and the signal level of a signal from the physical layer circuit to the processing circuit.

3. The circuit device according to claim 1, wherein
the physical layer circuit includes a high speed driver serving as a Universal Serial Bus (USB) high speed mode transmission circuit,
the data bus includes a data plus (DP) signal line that transmits a USB signal DP and a data minus (DM) signal line that transmits a USB signal DM, and
the measurement circuit measures the voltage of at least one of the DP signal line and the DM signal line of the data bus coupled to the high speed driver.

4. The circuit device according to claim 3, wherein
the measurement circuit measures the voltage of the DP signal line or the DM signal line in a period when a USB packet is not being communicated.

5. An electronic device, comprising:
the circuit device according to claim 1.

6. A mobile body, comprising:
the circuit device according to claim 1.

7. A circuit device, comprising:
a physical layer circuit coupled to a data bus;
a processing circuit that controls the physical layer circuit and performs communications processing through the data bus, wherein
the processing circuit operates with a voltage of a ground line as a power supply voltage on a low potential side, and
the physical layer circuit operates based on a first power supply voltage on the low potential side supplied from a first power supply line not coupled to the ground line in the circuit device, and a second power supply voltage on a high potential side set with reference to the first power supply voltage;
a first terminal coupled to the ground line; and
a second terminal coupled to the first power supply line that supplies the first power supply voltage, wherein
the physical layer circuit operates based on the first power supply voltage supplied from outside of the circuit device to the second terminal.

8. The circuit device according to claim 7, comprising:
a voltage generation circuit that generates the second power supply voltage with reference to the first power supply voltage supplied to the second terminal.

9. The circuit device according to claim 7, comprising:
a third terminal coupled to a second power supply line that supplies the second power supply voltage,
wherein the physical layer circuit operates based on the second power supply voltage supplied from outside of the circuit device to the third terminal through the second power supply line.

10. An electronic device, comprising:
the circuit device according to claim 7.

11. A mobile body, comprising:
the circuit device according to claim 7.

* * * * *